US005620932A

United States Patent [19]

Fujimaki

[11] Patent Number: 5,620,932
[45] Date of Patent: Apr. 15, 1997

[54] METHOD OF OXIDIZING A SEMICONDUCTOR WAFER

[75] Inventor: Nobuyoshi Fujimaki, Annaka, Japan

[73] Assignee: Shin-Etsu Handotai Co., Ltd., Tokyo, Japan

[21] Appl. No.: 266,866

[22] Filed: Jul. 5, 1994

[30] Foreign Application Priority Data

Jul. 6, 1993 [JP] Japan .................................. 5-192726

[51] Int. Cl.$^6$ .................................................. H01L 21/02
[52] U.S. Cl. ............................................................ 438/770
[58] Field of Search ...................................... 437/239, 926

[56] References Cited

U.S. PATENT DOCUMENTS

| | | | |
|---|---|---|---|
| 3,790,404 | 2/1974 | Garnache et al. | 117/106 R |
| 4,027,380 | 6/1977 | Deal et al. | 29/571 |
| 4,139,658 | 2/1979 | Cohen et al. | 427/93 |
| 4,154,873 | 5/1979 | Hickox et al. | 427/82 |
| 4,214,919 | 7/1980 | Young | 148/1.5 |
| 4,268,538 | 5/1981 | Toole et al. | 427/93 |
| 4,976,612 | 12/1990 | Adams . | |
| 5,237,756 | 8/1993 | Hurwitt | 34/15 |
| 5,244,843 | 9/1993 | Chau et al. | 437/239 |
| 5,407,349 | 4/1995 | Hansotte, Jr. et al. | 432/241 |

FOREIGN PATENT DOCUMENTS 93310226.1 12/1993 European Pat. Off. ........ H01L 21/00
0602995 6/1994 European Pat. Off. .... H01L 21/3105

OTHER PUBLICATIONS

Cheung, Steven et al, "Characterization of Contamination within an Atmospheric Pressure, Vertical Furnace, Oxidation System by in Situ Purity Measurements", Institute of Enviromental Sciences, 1992 Proceedings, vol. 1 pp. 353–360.

Wolf, Stanley et al, "Silicon Processing for the VLSI ERA", vol. 1, pp. 198–207 and 222 (1986).

F. Montillo High Temperature Annealing of Oxidized Silicon Surfaces Sep. 1971.

*Primary Examiner*—R. Bruce Breneman
*Assistant Examiner*—Matthew Whipple
*Attorney, Agent, or Firm*—Ronald R. Snider

[57] ABSTRACT

A semiconductor wafer, to form an oxide film, is oxidized in a heat treatment furnace and is annealed if necessary. When said wafer is taken out of said heat treatment furnace, an ambient gas containing water vapor is fed into said heat treatment furnace. The gap linear velocity of the ambient gas is set to 200 cm/min or more. If the ambient gas used at the time when the wafer is taken out of the furnace is a dry gas without water vapor, then an additional heat treatment is carried out using a hydrogen containing atmosphere at low temperature.

13 Claims, 2 Drawing Sheets

METHOD OF OXIDIZING A SEMICONDUCTOR WAFER

BACKGROUND OF THE INVENTION

This application claims the priority of Japanese Patent Application No. 5-192726 filed on Jul. 6, 1993 which is incorporated herein by reference.

FIELD OF THE INVENTION

This invention relates to a method of oxidizing a semiconductor wafer, and more precisely to a method of oxidizing a semiconductor wafer which allows formation of a high-quality oxide film on the semiconductor wafer with good reproducibility and little fluctuation in quality.

THE PRIOR ART

When manufacturing a semiconductor device, a process is required in which a semiconductor oxide film is formed on the semiconductor wafer by oxidizing the semiconductor wafer. The most common way to do this is to oxidize the silicon wafer to form a silicon oxide film. The thermal oxidation method is generally adopted as the method of thermal oxidation in which the semiconductor wafer (hereafter referred to as "wafer") is thermally oxidized to form a semiconductor oxide film (hereafter referred to as "oxide film"). In the thermal oxidation method, the wafer is placed in a quartz tube in a vertical- or horizontal-type heat treatment furnace. While an oxidizing source such as oxygen and water vapor is fed into the quartz tube, the wafer is heated up to approximately 1000° C. and oxidized.

The oxide film thus obtained by thermal oxidation has various electrical charges due to interface-states, traps in the film, etc. These charges are known to cause the surface potential of the semiconductor to vary and cause serious problems in performance (yield, reliability, etc.) of semiconductor integrated circuits prepared from this wafer. Because of this, various research has been carried out to study the charges in oxide films (see IEEE. Transaction on Electron Devices, Vol. ed-27, No. 3, March, 1980, pp. 606–608).

Other research has also shown that the charge density decreases as the oxidation temperature rises, and that the charge density is further reduced when annealing is carried out in an inert gas such as argon and nitrogen (see J. Electrochem. Soc.: Solid State Science, March, 1967, pp. 266–273 for details).

Subsequent detailed research has revealed that after the oxidation heat treatment, the charge density in the oxide film increases by the presence of dry oxygen in the ambient inert gas during annealing (see J. Electrochem. Soc.: Solid State Science, March, September, 1971, pp. 1463–1468 for details).

When forming the oxide film on the wafer, particularly when the horizontal type heat treatment furnace is used for the oxidation heat treatment, the so-called "backstreaming of atmospheric air" phenomenon from the open end of the furnace tube presents a problem. This phenomenon occurs as follows: when the wafers are taken out of the furnace after the oxidation and/or the annealing heat treatment, the high temperature gas in the furnace tube escapes outside and thus leaves a negative pressure in the furnace tube, causing the relatively cool atmospheric air to be introduced into the furnace tube.

When this phenomenon occurs, the cool atmospheric air from outside flows down into the lower portion of the furnace tube and causes a temperature gradient on the wafer surface. In addition, the introduction of oxygen and moisture in the atmospheric air increases the deviation of the film thickness of the oxide film. If the atmospheric air is contaminated, then the device will have defective characteristics. This "backstreaming of atmospheric air" phenomenon is also a cause of an increase in the fixed charge of the oxide film.

When the oxidation was carried out without preventing the "backstreaming of atmospheric air" phenomenon, in addition to the problem of increased fixed charges as described above, there was a problem in that the recombination lifetime of the minority carrier (hereafter referred to as "wafer lifetime") which indicated the quality of the oxide film differed between oxidation treatment batches.

When the oxidation and annealing are carried out without preventing the "backstreaming of atmospheric air" phenomenon, such as in the conventional process, it is believed that the moisture in the atmosphere is introduced into the furnace and decomposed by heat into hydrogen ions and hydroxyl groups. They (hydrogen ions in particular) are taken into the oxide film and adsorbed to the dangling bonds at the interface between oxide and semiconductor, thus reducing the surface recombination rate and causing the increase in the wafer lifetime. Furthermore, when the moisture content in the atmospheric air fluctuates, or when contaminating airborne impurities are present, the wafer lifetime will also fluctuate.

Therefore, the "backstreaming of atmospheric air" phenomenon has to be minimized as best we can. This inventor and others proposed a method in which the "backstreaming of atmospheric air" phenomenon was suppressed by keeping the gap linear velocity (obtained by dividing the flow rate of said ambient gas with the cross section of the gap between the aperture of said heat treatment furnace tube and the semiconductor wafer) at a prescribed value, thus reducing the fixed charge in the oxide film (see Japanese Patent Application (Tokugan) Hei 4-355269 for details).

However, if the gap linear velocity of the dry ambient gas at the time of taking the wafer out is increased so as to prevent the "backstreaming of atmospheric air" phenomenon, then there is the problem of a very short wafer lifetime. It is believed that the longer the wafer lifetime, the better the quality of the oxide film. The deviation of wafer lifetime reflects the deviation of the quality of the oxide films.

Typically, immediately after the annealing in the dry ambient gas following the oxidation heat treatment, many dangling bonds are assumed to be present at the interface between the oxide film and the semiconductor substrate. These dangling bonds are considered to be interface states and the cause of an increase in the surface recombination rate, thus reducing the wafer lifetime.

Keeping the quality of the oxide film formed on the wafer consistent will become more and more important in attempts to obtain semiconductor integrated circuits with a smaller size, higher density, higher speed, and higher yield. Therefore, sufficiently increasing the wafer lifetime, an indicator of the quality of the oxide film, and preventing its deviation will lead to improved quality of the oxide film, which will be a very significant accomplishment.

BRIEF SUMMARY OF THE INVENTION

An object of this invention is to provide a method of forming a high-quality oxide film on a semiconductor wafer which allows better reproducibility of the quality of the oxide film and improved quality of semiconductor substrates and integrated circuits.

This invention provides a method of oxidizing a semiconductor wafer using a heat treatment furnace, characterized by the fact that:

1) the ambient gas which flows out of the furnace contains water vapor, when the semiconductor wafer is taken out of the heat treatment furnace after said oxidizing treatment; and
2) the flow rate of said ambient gas divided by the cross section of the gap between the interior cross sectional surface of said heat treatment furnace tube and said semiconductor wafer in said heat treatment furnace tube (hereafter referred to as "the gap linear velocity") is 200 cm/min or more.

This invention also provides a method of oxidizing a semiconductor wafer using a heat treatment furnace, characterized by the fact that:
1) the ambient gas which flows out of the furnace is a dry atmosphere or a gas containing water vapor, when said semiconductor wafer is taken out of said heat treatment furnace after said oxidizing treatment; and
2) the gap linear velocity of the ambient gas is 200 cm/min or more; and
3) the heat treatment of the semiconductor wafer is carried out using ambient gas containing hydrogen immediately after the oxidizing treatment or after the semiconductor is taken out of the heat treatment furnace.

The heat treatment using an ambient gas containing hydrogen is preferably carried out in an ambient gas which contains 1% or more hydrogen, and the temperature is preferably 300°–500° C.

DETAILED DESCRIPTION

Figure 1:
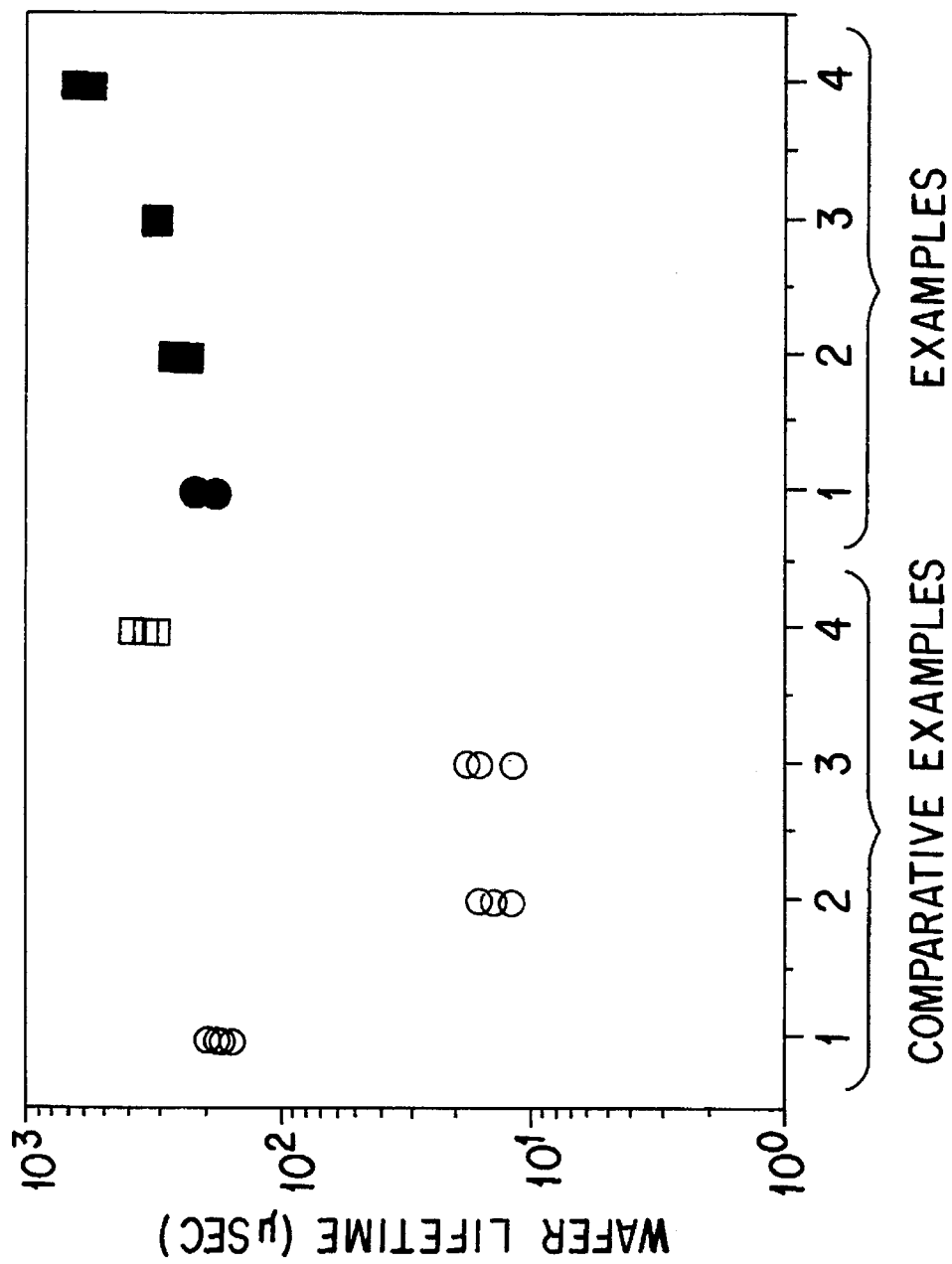
FIG. 1 is a graph which shows the recombination lifetime (wafer lifetime) τr of the minority carrier(s) in the Examples and Comparative Examples.

Based on the findings described above, the inventors sought a method of minimizing these effects by minimizing the "backstreaming of atmospheric air" phenomenon and minimizing the dangling bond density as described above. As a result, in this invention, when the wafer is taken out of the furnace after the oxidation/annealing process, the gap linear velocity of the ambient gas coming out from the furnace is increased (200 cm/min or more) so as to prevent the atmospheric air from entering the furnace, and hydrogen ions are supplied by feeding an ambient gas containing water vapor at the time when the wafer is taken out of the furnace, or by carrying out a heat treatment in an ambient gas containing hydrogen after the oxidation/annealing process. As a result, hydrogen ions are adsorbed to the dangling bonds mentioned above and the density of the dangling bonds is reduced.

The heat treatment using an ambient gas containing hydrogen, as described above, can either be conducted in the same heat treatment furnace immediately after the oxidation treatment of the wafer, or a heat treatment in ambient hydrogen can be carried out after the wafer is taken out of the furnace. Also, for even greater effect, it is possible to carry out the heat treatment with a hydrogen containing gas immediately after the oxidation or after the wafer is taken out of the furnace, in addition to using an ambient gas containing water vapor when taking out the wafer after the oxidation treatment.

Examples of this inventions are described below in detail. A polished wafer with a prescribed thickness was cut out from a silicon single crystal rod pulled up using the Czochralski method. The wafer had a diameter of 5", a plane orientation of <100>, a conductivity type of p-type, a specific resistance of approximately 10 Ω·cm, and an interstitial oxygen concentration of approximately $1.4 \times 10^{18}$ atoms/cm$^3$.

EXAMPLE 1

Wafers prepared as described above were cleaned on the wafer surface. Immediately after a drying process they were inserted into an oxidation furnace, and a heat treatment was carried out in a dry oxygen atmosphere at 1000° C. for 1 hour to form an oxide film with a 50 nm thickness. The wafers were taken out of the furnace, using wet oxygen with water vapor as the ambient gas during removal. The gap linear velocity of this ambient gas was set to 400 cm/min.

EXAMPLE 2

Wafers from the same lot used in Example 1 were cleaned, dried, and oxidized under the same conditions as for Example 1. The wafers were taken out of the furnace, using dry oxygen as the ambient gas. The gap linear velocity of this ambient gas was set to 400 cm/min. A heat treatment was then carried out at 400° C. for 30 minutes in a mixed atmosphere of hydrogen (3%) and nitrogen (97%).

EXAMPLE 3

Wafers from the same lot used in Example 1 were cleaned, dried, and oxidized under the same conditions as for Example 1. The wafers were taken out of the furnace, using dry nitrogen as the ambient gas. The gap linear velocity of this ambient gas was set to 400 cm/min. A heat treatment was then carried out at 400° C. for 30 minutes in a mixed atmosphere of hydrogen (3%) and nitrogen (97%).

EXAMPLE 4

Wafers from the same lot used in Example 1 were cleaned, dried, and oxidized under the same conditions as for Example 1. The wafers were taken out of the furnace, using wet oxygen with water vapor as the ambient gas. The gap linear velocity of this ambient gas was set to 400 cm/min. A heat treatment was then carried out at 400° C. for 30 minutes in a mixed atmosphere of hydrogen (3%) and nitrogen (97%).

Comparative Example 1

Wafers from the same lot used in Example 1 were cleaned, dried, and oxidized under the same conditions as for Example 1. The wafers were taken out of the furnace, using dry oxygen as the ambient gas. The gap linear velocity of this ambient gas was set to 160 cm/min.

Comparative Example 2

Wafers from the same lot used in Example 1 were cleaned, dried, and oxidized under the same conditions as for Example 1. The wafers were taken out of the furnace, using dry oxygen as the ambient gas. The gap linear velocity of this ambient gas was set to 400 cm/min.

Comparative Example 3

Wafers from the same lot used in Example 1 were cleaned, dried, and oxidized under the same conditions as for Example 1. The wafers were taken out of the furnace, using dry nitrogen as the ambient gas. The gap linear velocity of this ambient gas was set to 400 cm/min.

Comparative Example 4

Wafers from the same lot used in Example 1 were cleaned, dried, and oxidized under the same conditions as for Example 1. The wafers were taken out of the furnace, using dry oxygen as the ambient gas. The gap linear velocity of this ambient gas was set to 160 cm/min. A heat treatment was then carried out at 400° C. for 30 minutes in a mixed atmosphere of hydrogen (3%) and nitrogen (97%).

FIG. 1 shows the wafer lifetime measurements for the wafers from the Examples and Comparative Examples described above. As clearly shown in this figure, the wafer lifetimes were sufficiently long (100 microseconds or more) under the conditions of Examples 1 through 4. On the other hand, under the conditions of Comparative Examples 1 and 4, where the gap linear velocity of the ambient gas at the time the wafers were taken out of the furnace was lower under the conditions of Comparative Examples 1 and 4, the recombination lifetimes were relatively long (100 microseconds or more) but the lifetimes were very short (about 10 microseconds) under the conditions of Comparative Examples 2 and 3 where said gap linear velocity was higher.

Using wafers from the same lot used in the Examples and Comparative Examples described above, the treatment was carried out on the same day under the conditions of Example 4, and Comparative Examples 1 and 4. The treatment was then repeated to study the fluctuation in the wafer lifetimes between runs. The results are shown in FIG. 2.

Figure 2:
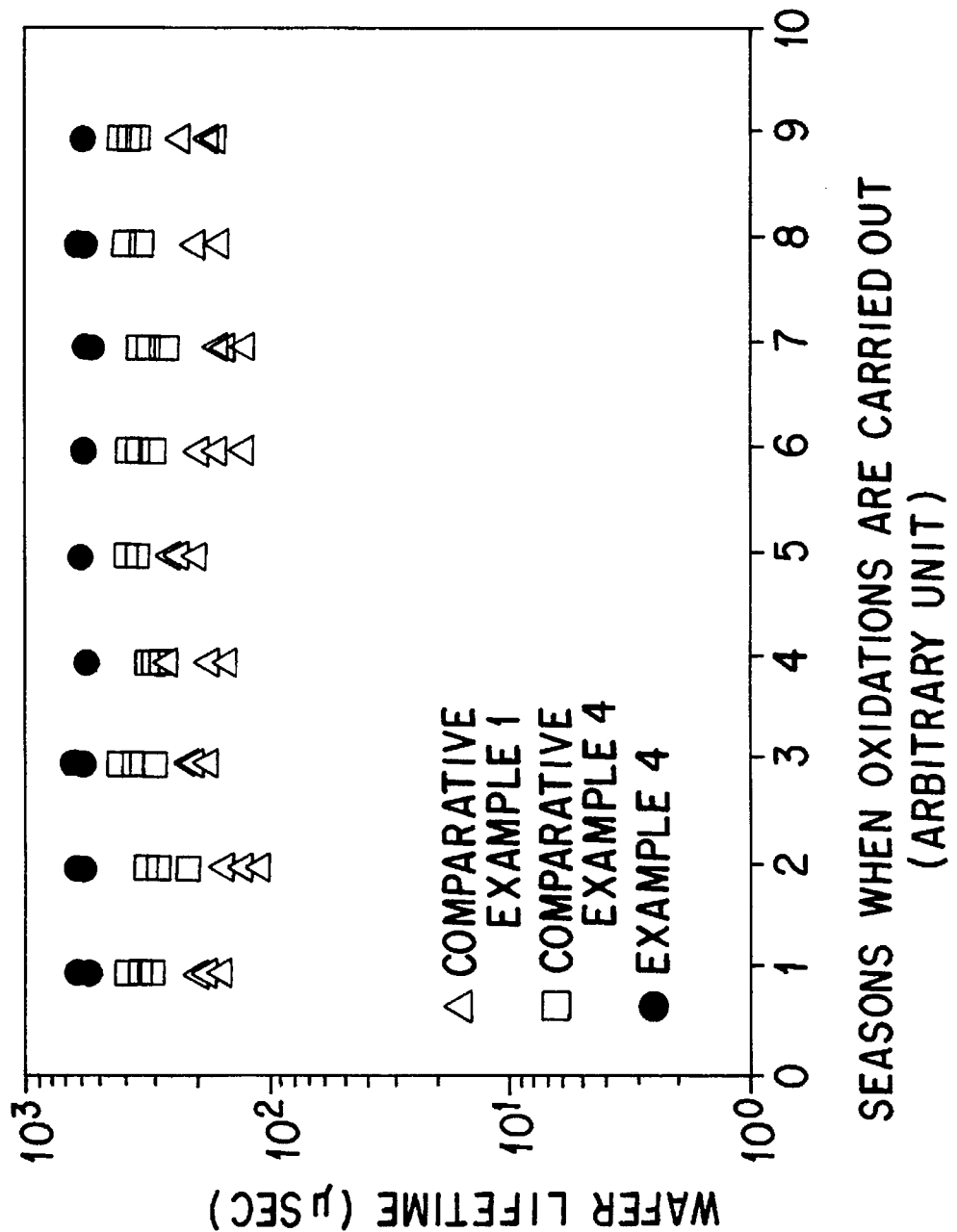
FIG. 2 is a graph which shows how the recombination lifetime (wafer lifetime) τr of the minority carrier(s) in the Examples and Comparative Examples fluctuates between different runs at which the oxidation is carried out.

As clearly shown in FIG. 2, the wafer lifetimes for Example 4 are sufficiently long (approximately 600 microseconds), and the fluctuation between different runs is small. On the other hand, the lifetimes for Comparative Example 1 are 200 microseconds and the lifetimes for Comparative Example 4 are 300–400 microseconds, respectively, which are relatively short and the variation between different runs is greater compared with that for Example 4. It was therefore observed that when the gap linear velocity of the ambient gas at the time when the wafers are taken out of the furnace is lowered such as in Comparative Examples 1 and 4, although the wafer lifetimes become relatively long, the measurements are affected by the atmospheric air due to the "backstreaming of atmospheric air" phenomenon, resulting in greater variations between different runs.

This invention allows for formation by heat of a high-quality oxide film and an extremely stable quality of the underlying semiconductor wafer.

What is claimed is:

1. A method of oxidizing a semiconductor wafer using a heat treatment furnace comprising the steps of:
    oxidizing said wafer in said furnace;
    taking said semiconductor wafer out of said heat treatment furnace after said oxidizing step while feeding an ambient gas through and out of said heat treatment furnace,
    wherein:
        said ambient gas contains water vapor; and
        the flow rate of said ambient gas divided by the cross section of the gap between the interior cross sectional surface diameter of said heat treatment furnace and said semiconductor wafer is 200 cm/min or more.

2. A method of oxidizing a semiconductor wafer according to claim 1, wherein a step of further heat treatment of said semiconductor wafer is carried out using ambient gas containing hydrogen ($H_2$) after said oxidizing step.

3. A method of oxidizing a semiconductor wafer according to claim 2, wherein said ambient gas containing hydrogen contains 1% or more hydrogen.

4. A method of oxidizing a semiconductor wafer as described in claim 2, wherein said heat treatment using ambient gas containing hydrogen is carried out 300°–500° C.

5. A method of oxidizing a semiconductor wafer according to claim 1, wherein further heat treatment of said semiconductor wafer is carried out using ambient gas containing hydrogen after being taken out of from said heat treatment furnace.

6. A method of oxidizing a semiconductor wafer according to claim 5, wherein said ambient gas containing hydrogen contains 1% or more hydrogen.

7. A method of oxidizing a semiconductor wafer as described in claim 5, wherein said heat treatment using ambient gas containing hydrogen is carried out 300°–500° C.

8. A method of oxidizing a semiconductor wafer using a heat treatment furnace comprising the steps of:
    oxidizing said wafer in said furnace;
    taking said semiconductor wafer out of said heat treatment furnace after said oxidizing step while feeding an ambient gas through and out of said heat treatment furnace,
    wherein:
        said ambient gas is a dry atmosphere;
        the flow rate of said ambient gas divided by the cross section of the gap between the interior cross sectional surface diameter of said heat treatment furnace and said semiconductor wafer is 200 cm/min or more; and
        a step of further heat treatment of said semiconductor wafer is carried out using ambient gas containing hydrogen $H_2$ after said oxidizing step.

9. A method of oxidizing a semiconductor wafer according to claim 8, wherein said ambient gas containing hydrogen contains 1% or more hydrogen.

10. A method of oxidizing a semiconductor wafer as described in claim 8, wherein said heat treatment using ambient gas containing hydrogen is carried out at 300°–500° C.

11. A method of oxidizing a semiconductor wafer using a heat treatment furnace comprising the steps of:
    oxidizing said wafer in said furnace;
    taking said semiconductor wafer out of said heat treatment furnace after said oxidizing step while feeding an ambient gas through and out of said heat treatment furnace,
    wherein:
        said ambient gas is a dry atmosphere;
        the flow rate of said ambient gas divided by the cross section of the gap between the interior cross sectional surface of said heat treatment furnace and said semiconductor wafer is 200 cm/min or more; and
        said semiconductor wafer receives further heat treatment using ambient gas containing hydrogen $H_2$ just after being taken out of said heat treatment furnace.

12. A method of oxidizing a semiconductor wafer according to claim 11, wherein said ambient gas containing hydrogen contains 1% or more hydrogen.

13. A method of oxidizing a semiconductor wafer as described in claim 11, wherein said heat treatment using ambient gas containing hydrogen is carried out at 300°–500° C.

* * * * *